United States Patent [19]

Noguchi et al.

[11] Patent Number: 5,262,984
[45] Date of Patent: Nov. 16, 1993

[54] NON-VOLATILE MEMORY DEVICE CAPABLE OF STORING MULTI-STATE DATA

[75] Inventors: Kenji Noguchi; Shinichi Kobayashi; Tsuyoshi Toyama, all of Hyogo, Japan

[73] Assignee: Mitsubishi Denki Kabushiki Kaisha, Tokyo, Japan

[21] Appl. No.: 386,484

[22] Filed: Jul. 28, 1989

[30] Foreign Application Priority Data

Jul. 29, 1988 [JP] Japan .................. 63-191382

[51] Int. Cl.⁵ ........................................... G11C 11/56
[52] U.S. Cl. ..................................... 365/185; 365/45; 365/168
[58] Field of Search .................. 365/184, 185, 104, 45, 365/49, 168

[56] References Cited

U.S. PATENT DOCUMENTS

| | | | |
|---|---|---|---|
| 4,449,203 | 5/1984 | Adlhoch | 365/104 |
| 4,627,027 | 12/1986 | Rai et al. | 365/45 |
| 4,794,564 | 12/1988 | Watanabe | 365/184 |
| 4,809,224 | 2/1989 | Suzuki et al. | 365/168 |
| 4,964,079 | 10/1990 | Devin | 365/168 |
| 5,043,940 | 8/1991 | Harari | 365/168 |

FOREIGN PATENT DOCUMENTS 0255963 of 1988 European Pat. Off. .
9012400 10/1990 PCT Int'l Appl. ............ 365/189.07
2166615A of 1985 United Kingdom .

OTHER PUBLICATIONS

"Japanese Develop Non-Destructive Analog Semiconductor Memory" Electronics Review, Jul. 1974, pp. 29-30.
IBM Technical Disclosure Bulletin: "Three-state MNOS FET Memory Array", vol. 18 No. 12 May 1976.
IBM Technical Disclosure Bulletin: "Multi-bit Storage FET EAROM cell", vol. 24 No. 7A Dec. 1981.
IEEE Journal of Solid State Circuits: "A Four-State EEPROM Using Floating-Gate Memory Cells", by C. Bleiker et al, vol. SC-22, No. 3, Jun. 1987, pp. 460-463.

Primary Examiner—Joseph L. Dixon
Assistant Examiner—Jack A. Lane
Attorney, Agent, or Firm—Lowe, Price, LeBlanc & Becker

[57] ABSTRACT

The input data comprising binary data to be stored are converted into multi-state data. A voltage of a level based on the converted multi-state data is applied to a source region to perform write operation to a memory transistor. As a result, the threshold voltage of the transistor is set to a value corresponding to the potential of the source region. In read operation a drain current generated in the memory transistor is detected and the multi-state data corresponding to the current are obtained. These multi-state data are converted into binary data to be outputted as output data.

13 Claims, 11 Drawing Sheets

NON-VOLATILE MEMORY DEVICE CAPABLE OF STORING MULTI-STATE DATA

BACKGROUND OF THE INVENTION

1. Field of the Invention

The present invention relates to an electrically erasable programmable read only memory (EEPROM) and particularly relates to a non-volatile memory device which is appropriate for storing multi-state data and for improving the degree of integration.

2. Description of the Related Art

FIG. 1 is a simplified block diagram showing the configuration of an EEPROM of a conventional type.

Referring to the drawing, the configuration is explained in the following.

This EEPROM comprises a memory cell array 8 including a memory cell 7; an address buffer 14 to hold address data input from outside; an X decoder 16 which selects a word line 1 with a signal of the address buffer 14; a Y decoder 18 which selects transistors 20 and 22 in a Y gate circuit 12 with a signal of the address buffer 14; a control signal source 24 which controls storage operation; a read/write stand-by control circuit 26 which controls the preparation of read/write operation based on the control signal source 24; a write circuit 28 which generates a write signal; a read circuit 32 which generates a read signal; a booster circuit and a timer circuit 30 which generate a high voltage to be applied to the memory cell array 8 in response to a signal of the write circuit 28; a high voltage switch 10 for applying a high voltage to a selected word line 1; a column latch and a high voltage switch 9 which apply a high voltage to a bit line 6 and a control gate line 5 selected by the Y decoder 18 and latch the high voltage state; a control gate circuit 46 which controls the control gate line 5 based on a signal of the write circuit 28; a write driver circuit 48 which controls a voltage signal of a bit line 6 based on a signal of the write circuit 28; a sense amplifier 50 which amplifies the data of the selected bit line 6; an input/output buffer 34 which holds an input/output signal; an input buffer 36 which holds an input signal; an output buffer 38 which holds an output signal in response to the output data of the read circuit 32 and the sense amplifier 50.

In the figure, a configuration circuit of a 1 bit line memory cell 7 in the memory cell array 8 is shown. The description on the configuration is given in the following.

The bit line 6 to be connected to a transistor 22 in a Y gate circuit 12, is connected to the column latch and the high voltage switch 9; a transistor 2, a memory transistor 3 and a transistor 72 are connected in series between the above-mentioned junction point and ground potential. A control line 5 to be connected to a transistor 20 in the Y gate circuit 12 is connected to the column latch and the high voltage switch 9 and the junction point is connected to the control gate of the memory transistor 3 with a control gate line 54 through a transistor 4. The gate of the transistor 72 is connected to the write circuit 28 through a connecting line 70.

FIG. 2 is a circuit diagram around a memory transistor equivalent to 1 bit of an EEPROM of a conventional type.

In the figure, following components are connected in series between the sense amplifier 50 and ground potential (GRD): the transistor 22 included in the Y gate circuit 12, the transistor 2 to be selected by X decoder 16, the memory transistor 3 which selectively stores or subtracts an electric charge and the transistor 72 to be turned ON or OFF by the signal of the write circuit 28. A signal line 52 from the Y decoder 18 is connected to the gate of the transistor 22; a word line 1 to be connected to X decoder 16 is connected to the gate of the transistor 2; the memory transistor 3 includes a control gate 56 and a floating gate 58, and a control gate line 54 is connected to the control gate 56; a connecting line 70 from the write circuit 28 is connected to the transistor 72; a connecting line from the high voltage switch $9a$ is connected to the junction point of the transistor 22 and the transistor 2. The configuration of the high voltage switch $9a$ is shown as follows: a transistor $Q_3$ and a condenser $C_1$ are connected in series between the source voltage $V_{pp}$ and a boosted pulse signal $\phi_1$; a transistor $Q_4$ is connected between the junction point of the transistor $Q_3$ and the condenser $C_1$, and the junction point of the transistor 22 and the transistor 2 (node N1); the gate of the transistor $Q_3$ is connected between the node N1 and the transistor $Q_4$; the gate of the transistor $Q_4$ is connected to a junction point between the transistor $Q_4$ and a node N2.

Functions of the high voltage switch $9a$ are explained simply in the following. The source voltage $V_{pp}$ is applied to the node N2 when transistor $Q_3$ is turned on, and further a voltage boosted by pulse $\phi_1$ is superimposed at the node N2; by the application of the boosted voltage to the gate of the transistor $Q_4$, the transistor $Q_4$ is made conductive, and the boosted voltage is applied to the node N1. Thereby the boosted voltage is applied to a drain region of the memory transistor 3 through the transistor 2 which is turned ON by the selection of the word line 1.

FIG. 3 is a simplified sectional drawing around a memory transistor of a common EEPROM.

Following is the explanation of the configuration. An $N^+$ drain diffusion region 78 and an $N^+$ source diffusion region 76 are formed at predetermined distance on a main surface of a semiconductor substrate 74. On the upper part of the region of the semiconductor substrate 74 which is to be channel region between the source diffusion region 76 and the drain diffusion region 78, a floating gate 58 is formed through a gate oxide layer 82. A control gate 56 is formed on the floating gate 58 through a gate oxide layer 80. The control gate 56 and the floating gate 58 are deformed to be closer to the semiconductor substrate 74 in the upper part of the drain diffusion region 78 as shown in the figure. Thereby the thickness of a part between the floating gate 58 and the drain diffusion region 78 becomes thinner than the thickness of the gate oxide layer 82, and the part becomes a tunnel oxide layer 84.

Following is the explanation of the operation of an EEPROM.

At first, erasing operation is explained. A positive high voltage ($V_{pp}$ for example 20 V) is applied to the control gate 56 and ground potential is given to the drain diffusion region 78, the source diffusion region 76 and the semiconductor substrate 74. In this state, a potential (for example 14 V) is given to the floating gate 58, which is a potential divided proportional to the capacitance of each of the tunnel oxide layer 84, the gate oxide layer 80 and the gate oxide layer 82. Thereby an electric field of an intensity (14 MV/cm) of 14 V divided by the film thickness of the tunnel oxide layer 84, for example 100 Å, is applied to the tunnel oxide layer 84. Because of this, the electrons in the drain diffusion region are injected into the floating gate. 58 with the tunnel phenomenon caused by the electric field.

The write operation is explained in the following. A high voltage is applied to the drain diffusion region 78 (for example 20 V) and ground potential is given to the control gate 56 and the semiconductor substrate 74; when a transistor 72 connected to the source diffusion region is made to be OFF, the source diffusion region 76 is floated; in this state a high voltage in the opposite direction to that in the above erase operation is applied to the tunnel oxide layer 84; therefore the electrons in the floating gate 58 are transferred excessively into the drain diffusion region 78 through the tunnel oxide layer 84 by the high voltage and write operation is performed.

As described in the above, data can be stored by changing the conditions of electrons in the floating gate 58.

The read operation is explained in the following. Prescribed voltage (for example 1 V) is applied to the drain diffusion region 78 and the source diffusion 76 region is grounded; ground potential is given to the control gate 56. In this state, data can be read by detecting the current between the drain diffusion region 78 and the source diffusion region 76, the current which is generated or not by an electron holding condition in the floating gate 58.

FIG. 4 shows a gate voltage/drain current characteristic of a conventional EEPROM.

In the figure, the gate voltage of the control gate is taken on the axis of abscissa and the drain current generated between the drain diffusion region and the source region is taken on the axis of ordinate. The figure shows a characteristic when the voltage of the drain diffusion region is 1 V. A straight line 60 shows a state when write operation is performed, and the floating gate is in a state where electrons are excessively drawn out, so that a depletion type characteristic is shown. The threshold voltage of the depletion type transistor is $-4$ V. On the other hand, a straight line 64 shows a state where erase operation is performed; it shows a characteristic of an enhancement type because the floating gate is in a state where electrons are injected into it. The threshold voltage of the enhancement type transistor is 4 V. In the read operation ground potential will be given to the control gate, and the drain current in this state shall be compared with an "Isen", a certain sense level, for detecting the presence of data. The data can be discriminated by a sense amplifier in such a way that when the drain current is more than "Isen" the datum is judged as "0" and when the current is less than "Isen" the datum is judged as "1".

A memory transistor of an EEPROM of a conventional type is constituted as described in the above; the transistor can therefore store only two values, "1" or "0", that is a binary value, according to the electron holding condition of the floating gate. This is not advantageous to an EEPROM which is inferior in the degree of integration to a DRAM.

In the title "A Four-State EEPROM Using Floating-Gate Memory Cells" in IEEE JOURNAL OF SOLID-STATE CIRCUITS VOL. SC-22, NO. 3, June 1987, it is disclosed that the write depth of a memory transistor is controlled with an address signal and a clock signal, and data are read by discriminating the drain current based on the write depth. In this document, it is not mentioned about the method according to the present invention wherein the injection quantity of electric current into the floating gate is controlled by giving prescribed voltage to the source region, nor is mentioned about the exchange of data with peripheral units based on binary data.

SUMMARY OF THE INVENTION

An object of the present invention is to provide a non-volatile memory device which is appropriate for developing the degree of integration.

Another object of the present invention is to provide a non-volatile memory device appropriate for developing a large scaled storage capacity.

A further object of the present invention is to provide a non-volatile memory device which is able to store multi-state data in a memory cell.

Yet another object of the present invention is to provide a non-volatile memory device in which each memory cell has high reliability in data holding characteristics in storing multi-state data.

A still further object of the present invention is to provide a non-volatile memory device in which write operation to a memory cell does not affect on another memory cell when multi-state data are stored.

An additional object of the present invention is to provide a non-volatile memory device in which the exchange of data with an exterior circuit is performed in the form of binary data and data are stored internally in the form of multi-state data.

To realize above-mentioned objects, a non-volatile memory device according to the present invention comprises a floating gate, electric charge injecting means and controlling means. Electric charge is injected to and subtracted out of the floating gate. The electric charge injecting means injects an electric charge into the floating gate. The controlling means controls the amount of electric charge to be injected by the charge injecting means. Threshold voltage is determined based on the injected amount of electric charge.

The threshold voltage of the non-volatile memory device, as mentioned above, varies in response to the injected amount of electric charge into the floating gate, so that multi-state data can be stored in a memory cell by detecting drain current of the memory transistor.

To accomplish the above-mentioned objects, in a certain aspect, non-volatile memory device according to the present invention comprises a plurality of floating gates, a plurality of electric charge injecting means and a plurality of controlling means; each of the charge injecting means is connected to common source voltage and includes source voltage releasing means for releasing the connection with source voltage when the injection of electric charge into each of the floating gates by each of the electric charge injecting means has been stopped.

In a non-volatile memory device constituted as mentioned above, when the injection of electric charge into each of the floating gate of memory cells is stopped, the connection of the memory cell to the source voltage is released, so that it does not affect the electric charge injection operation of another cell.

To accomplish the object as mentioned above, in another aspect, the non-volatile memory device according to the present invention comprises input signal converting means, writing means, a memory cell, reading means and output signal converting means. The input signal converting means converts a binary input signal into multi-state input signal larger than 2 values; the memory cell stores input data; the writing means writes the multi-state input signal to the memory cell as the input data; the reading means reads the multi-state data written in the memory cell; the output signal converting means converts the multi-state data read by the reading means into a binary output signal.

In the case of the non-volatile memory device constituted as mentioned above, the exchange of data with peripheral units of an EEPROM is performed in the form of binary data, and only data holding is done in the form of multi-state data, so that the memory device can be developed to a large capacity one, keeping the connections to the peripheral units as they are without special consideration.

The foregoing and other objects, features, aspects and advantages of the present invention will become more apparent from the following detailed description of the present invention when taken in conjunction with the accompanying drawings.

BRIEF OF THE DRAWINGS

DESCRIPTION OF THE PREFERRED EMBODIMENTS

Figure 5:
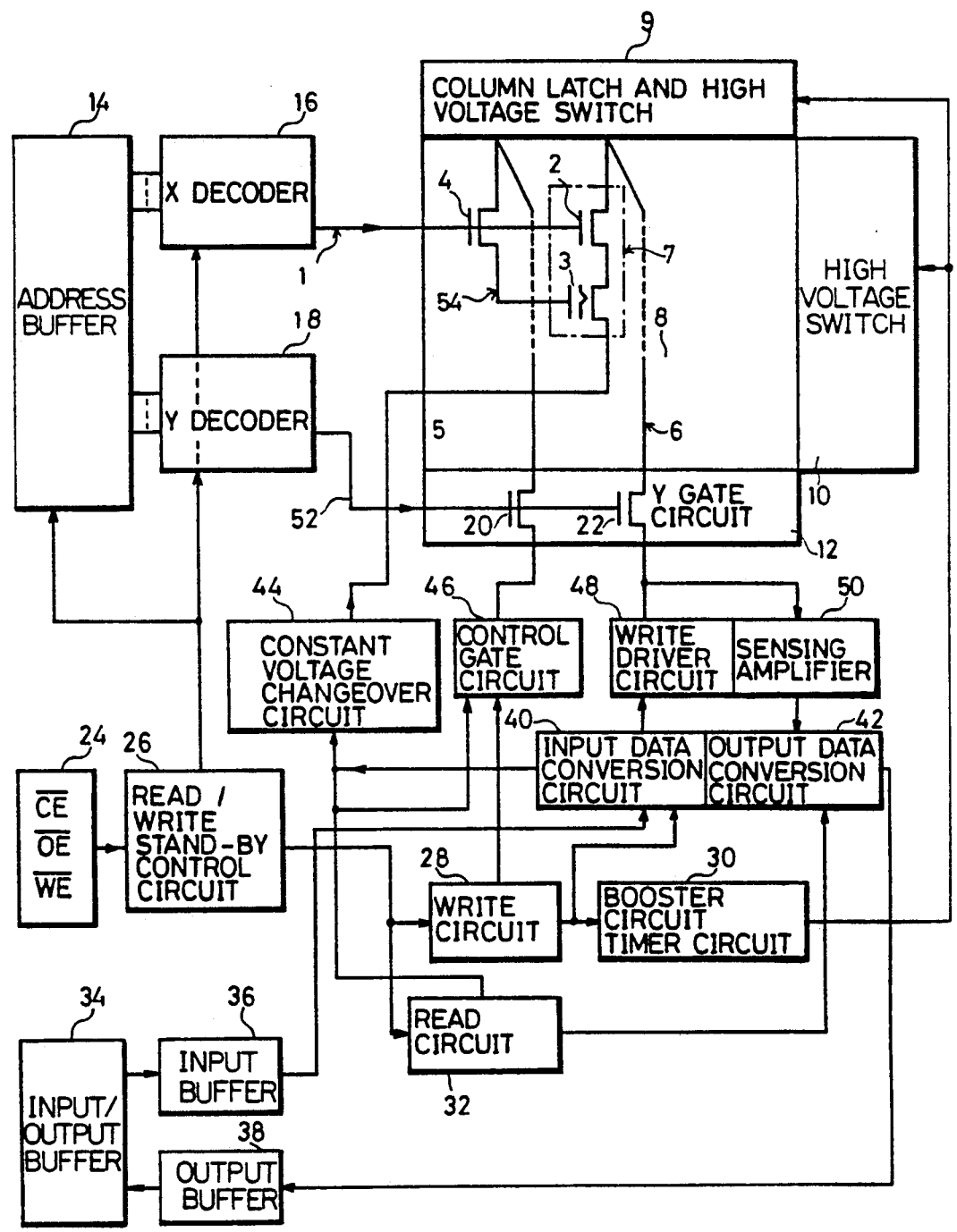
FIG. 5 is a simplified block diagram showing the configuration of an EEPROM according to an embodiment of the present invention.

FIG. 5 is a simplified block diagram showing the configuration of an EEPROM according to an embodiment of the present invention.

Figure 1:
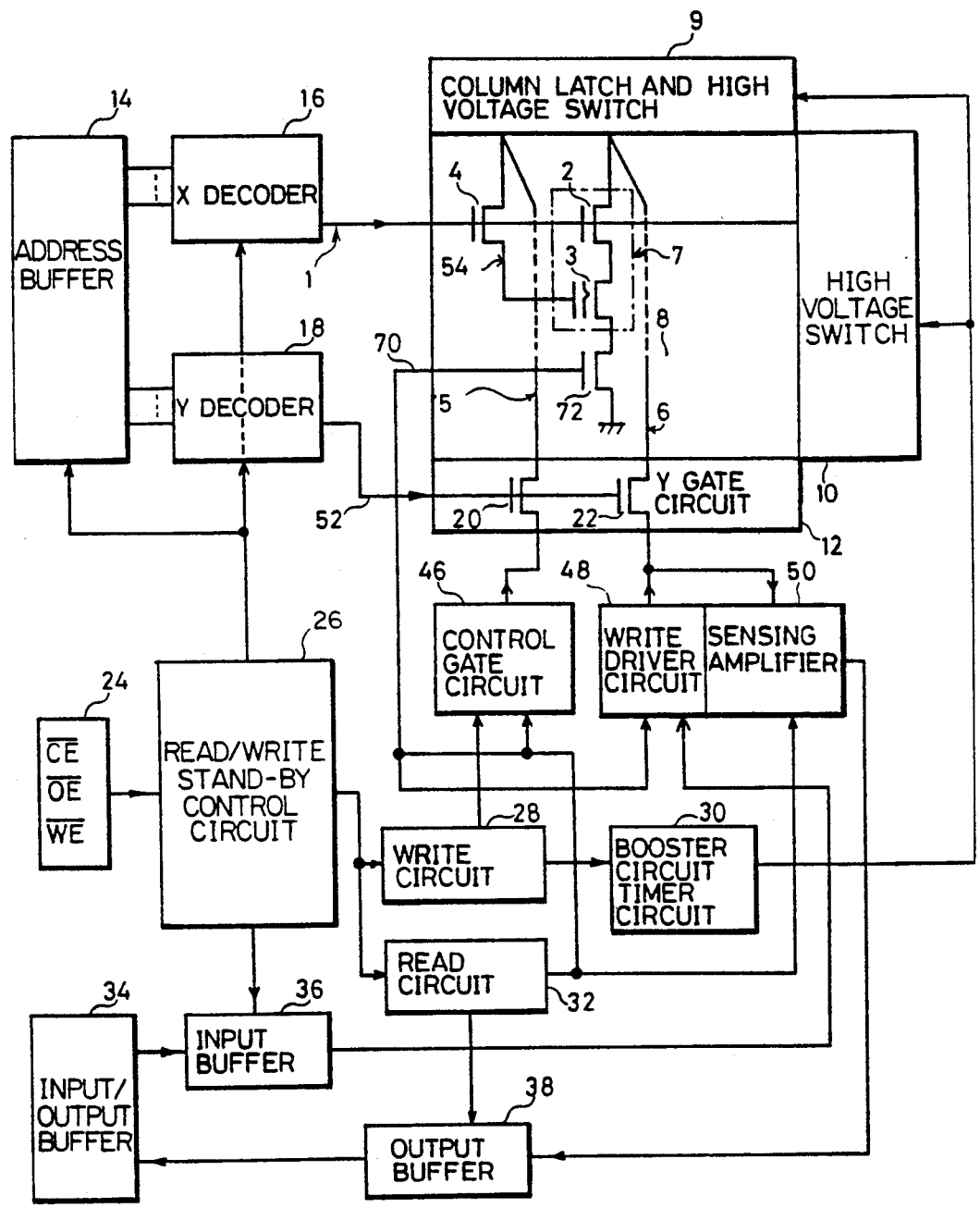
FIG. 1 is a block diagram showing the configuration of a conventional EEPROM.

The explanation will be given mainly on the different points between the block diagram shown in FIG. 5 and that of a conventional EEPROM shown in FIG. 1.

The source region of a transistor 3 of a memory cell 7 is not connected to ground potential but is connected to a constant voltage changeover circuit 44. The constant voltage changeover circuit 44 changes the voltage level for applying to a source region in the write operation into a memory transistor 3 based on a signal output from an input (signal) data conversion circuit 40. The input data conversion circuit 40 converts an input signal output from an input buffer 36 through input/output buffer 34 into a signal of a prescribed form. An output signal of a sense amplifier 50 is supplied to an output buffer 38 through an output data conversion circuit 42. The output data conversion circuit 42 converts a multistate signal output from the sense amplifier 50 into a binary signal of a conventional type; therefore the signals to be input or output through the input/output buffer 34 according to this embodiment are not different from those to be input or output through an input/output buffer of a conventional device. Owing to this, the conventional memory holding operation is possible without paying any consideration on the exchange of data between the EEPROM according to the present invention and its peripheral units.

Figure 2:
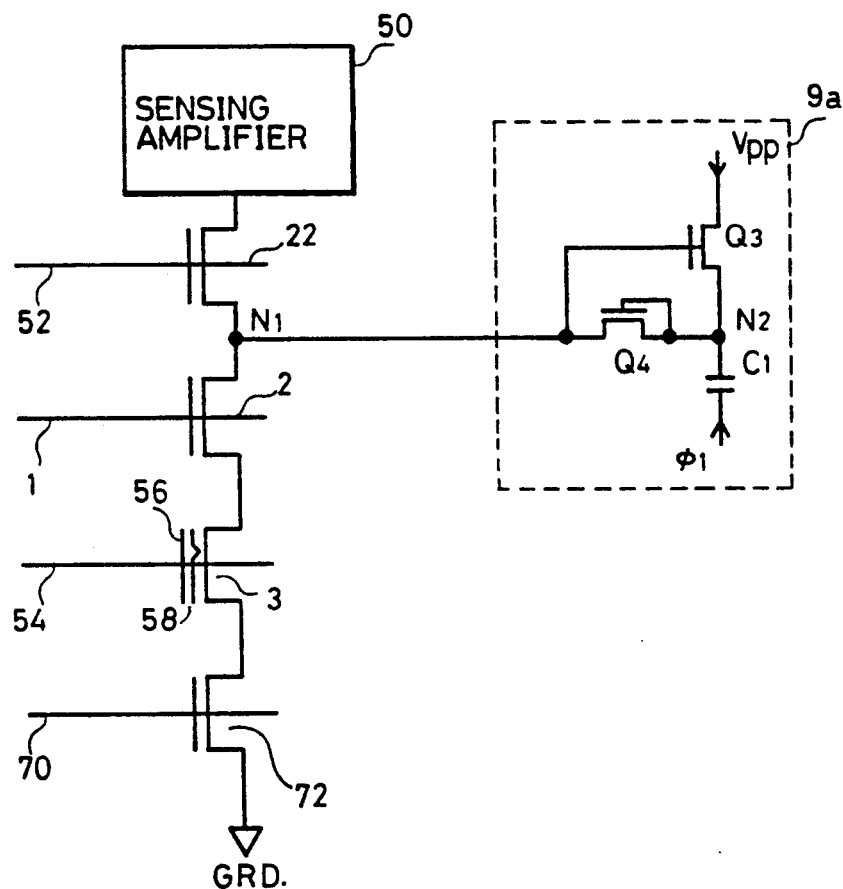
FIG. 2 is a circuit diagram showing the configuration around a memory cell of 1 bit of a conventional EEPROM.
Figure 3:
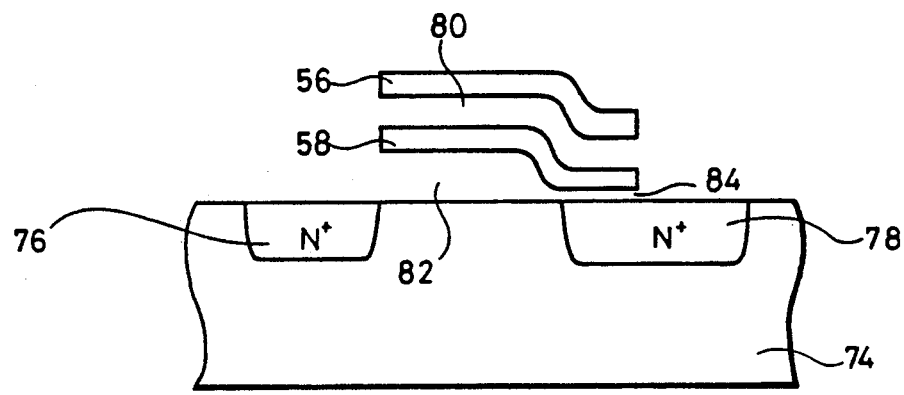
FIG. 3 is a sectional drawing of the outline of the configuration of a general EEPROM.
Figure 4:
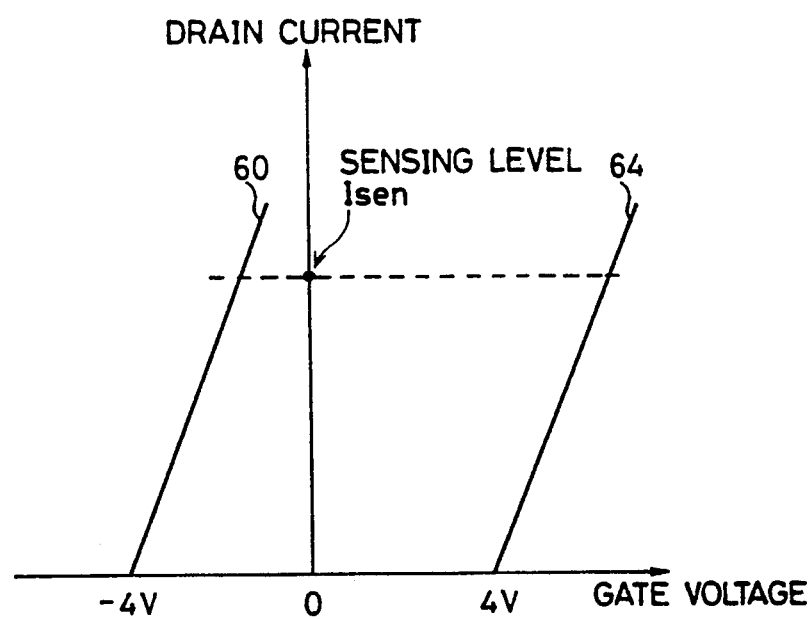
FIG. 4 is a characteristic chart showing the relation between a gate voltage and a drain current of a conventional EEPROM.
Figure 6:
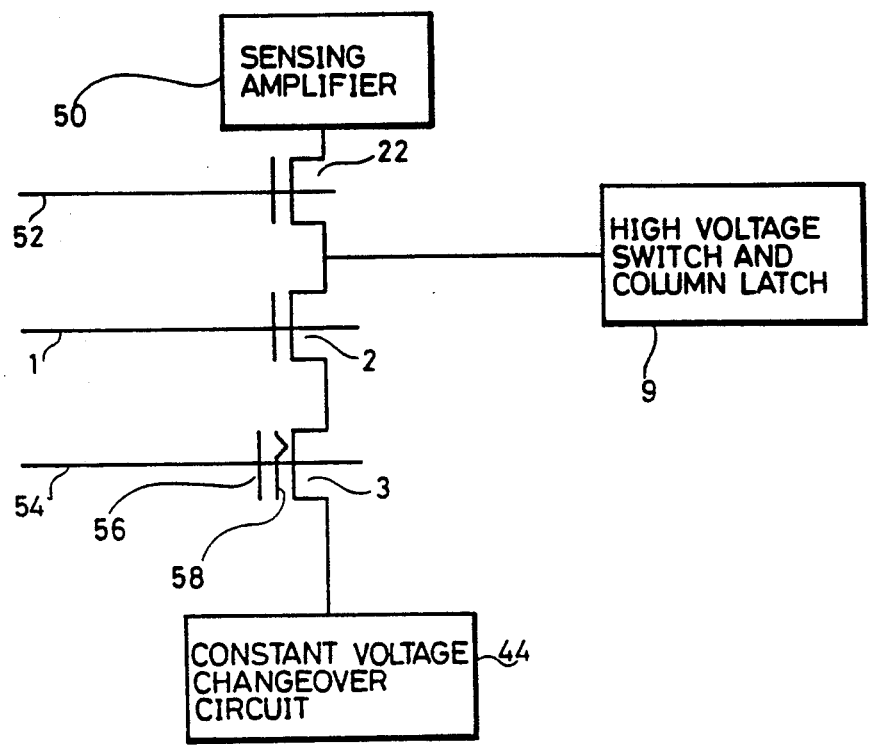
FIG. 6 is a simplified circuit diagram of 1 bit memory cell according to the embodiment of the present invention.

FIG. 6 shows the embodiment of the present invention and is a simplified drawing showing a configuration circuit of a memory cell for 1 bit corresponding to FIG. 2 which shows an example of a conventional type.

Following is the explanation of the characterizing parts of this example compared with the examples of conventional devices.

The source region of the memory transistor 3 including a control gate 56 and a floating gate 58 is connected to the constant voltage changeover circuit 44. The constant voltage changeover circuit 44 arbitrarily changes the source region voltage of the memory transistor 3 in write operation as mentioned in the above.

Figure 7:
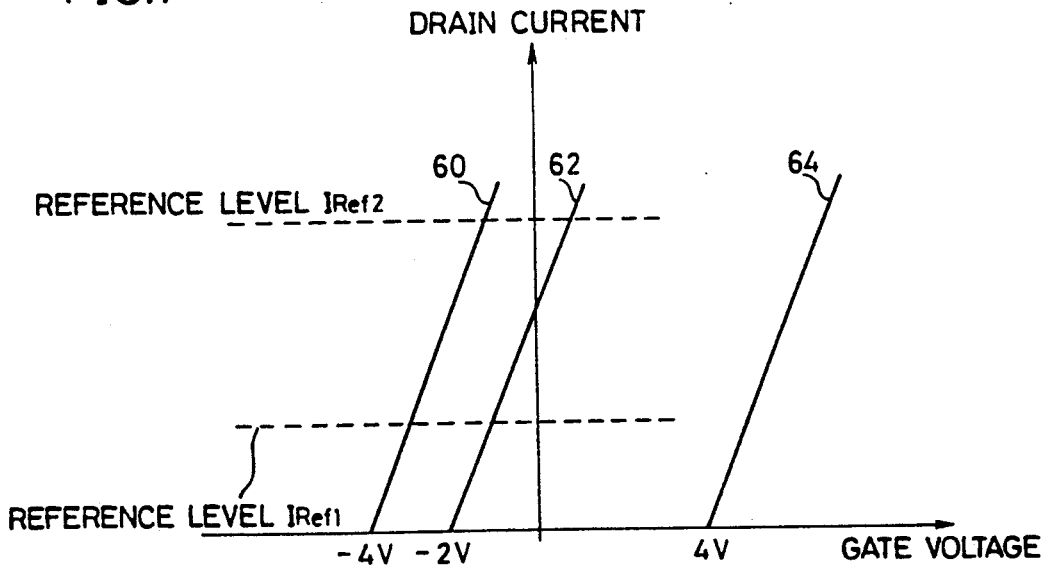
FIG. 7 is a characteristic chart showing the relation between a gate voltage and a drain current of a memory transistor according to the embodiment of the present invention.

FIG. 7 is a chart showing the relation between the gate voltage and the drain current of a memory transistor in the embodiment of the present invention.

In the figure, a gate voltage of a memory transistor is taken on the axis of abscissa and a drain current of the memory transistor is taken on the axis of ordinate; three kinds of current characteristics are expressed with straight lines 60, 62 and 64 and two kinds of reference levels $Iref_1$ and $Iref_2$ are shown with broken lines.

The explanation is given in the following on the operation of an EEPROM in an embodiment of the present invention referring to FIG. 6 and FIG. 7.

On the erase operation the explanation is not described because it is the same as that of the conventional example. In this erased state, the threshold voltage of a memory transistor is 4 V and the current characteristic is shown as a straight line 64 in FIG. 7.

The write operation is explained in the following. The operation is performed in the same manner as that in the conventional case except that the voltage generated by the constant voltage changeover circuit 44 is supplied to the source region of the memory transistor 3. In other words, 0 V is applied to the control gate 56;

a high voltage (for example 20 V) is applied to the drain region of the memory transistor; a certain voltage generated by the constant voltage changeover circuit 44 for example 2 V is applied to the source region of the memory transistor 3. Then, in the same way as in the case of a conventional example, electrons in the floating gate 58 are subtracted out into the drain diffusion region by the tunnel phenomenon through the tunnel oxide layer between the floating gate 58 and the drain region of the memory transistor 3. The threshold voltage of the memory transistor 3 is therefore lowered little by little until diffusion region is 2 V, and the voltage of the control gate is 0 V and its threshold value is −2 V, which means that the transistor is in an ON state. Because of this, a current starts to flow in the channel region of a semiconductor substrate interposed between the drain diffusion region and the source diffusion region. In other words, a current flows from the column latch and the high voltage switch 9 toward the memory transistor 3 through a transistor 2. Generally in an EEPROM a booster circuit called a charge pump is used for supplying high voltage but the charge pump itself has not ability for generating electric power. Therefore when the current stops flowing into the memory transistor 3 the booster circuit cannot keep holding the high voltage and the level of the voltage is lowered. Then an electric field strong enough cannot be applied to the tunnel oxide layer and the tunnel phenomenon does not occur, so that write operation cannot be held on-going. In other words, when the write operation is performed in applying a constant voltage to the source diffusion region of the memory transistor 3, until the channel region becomes conductive the threshold voltage of the memory transistor moves toward a depletion side, but when the channel region becomes conductive the write operation does not proceed further and it stops in that state. In the above example, the threshold voltage of the memory transistor is −2 V and the current characteristic of the transistor is expressed with a straight line 62 in FIG. 7.

When a voltage generated by the constant voltage changeover circuit 44 for example 4 V is applied to the source diffusion region of the memory transistor 3, similar operation to the above is performed and the threshold voltage changes till it reaches −4 V, but it does not proceed further. In this state, the threshold voltage of the memory transistor is −4 V, and the current characteristic of the transistor is expressed with a straight line 60 in FIG. 7.

The writing depth (threshold voltage) of a memory transistor is controlled by performing write operation in applying prescribed voltage generated by the constant voltage changeover circuit 44 to the source diffusion region of the memory transistor 3.

Figure 8:
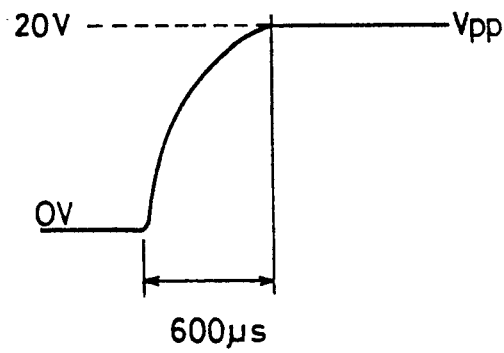
FIG. 8 is a waveform chart of a control gate voltage used for the simulation of an electric field variation for a tunnel oxide layer the erase operation of a general memory transistor.
Figure 9:
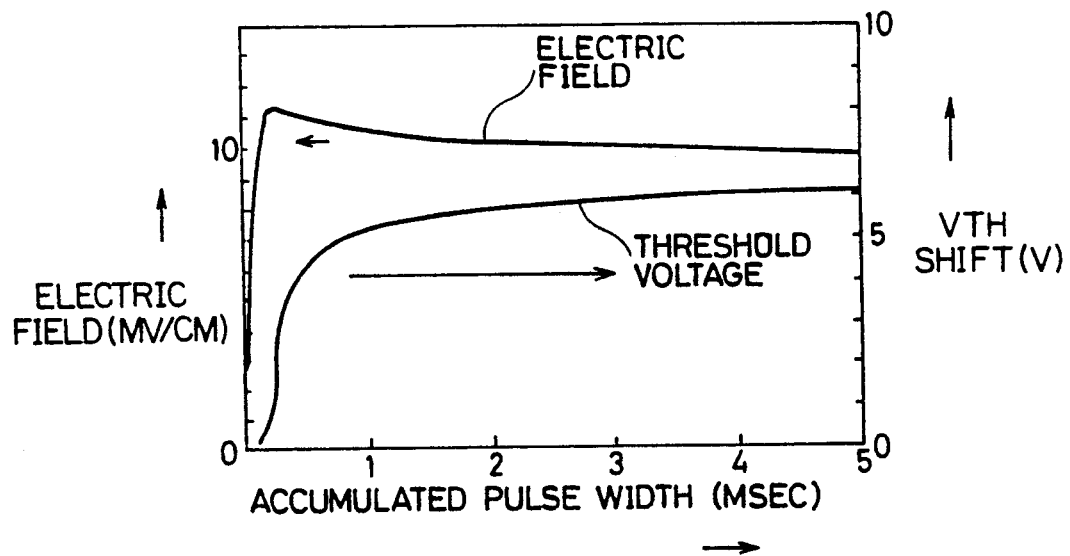
FIG. 9 is a drawing showing the simulation result of an electric field variation relating to the tunnel oxide layer shown in FIG. 8.

The explanation is given on the variation of an electric field relating to a tunnel oxide layer referring to FIG. 8 and FIG. 9.

FIG. 8 shows the waveform chart of a control gate voltage $v_{pp}$ used in the simulation of the charge of a threshold voltage and the change of an electric field in the erase operation.

According to this figure, the rising time from 0 V to 20 V of the source voltage $V_{pp}$ is 600 μs.

FIG. 9 is a charge expressing the relations between the change of a threshold voltage and the change of time, and between the change of an electric field and the change of time.

In the figure, the change of time is taken on the axis of abscissa; the change of a threshold voltage is taken on the axis of ordinate on the right side; the change of an electric field is taken on the axis of ordinate on the left side. This simulation result shows that at first an electric field changes largely with the change of time and following the change of the electric field the change of the threshold voltage occurs. It is also shown that after a certain time, the changing ranges of the electric field and the threshold voltage become small and they settle down to stable conditions. Judging from the simulation result in the erase operation, we can analogize that a similar tendency to the above will be shown in write operation. Accordingly in write operation, after the lapse of a certain time the change of the electric field will become small, and with the decrease in the change of the electric field the change of the threshold voltage will be also decreased and both of these values will settle down to certain values.

The read operation is explained in the following. In this case, read operation is performed under the condition that 1 V is applied to the drain diffusion region and 0 V is applied to the control gate 56 and the source diffusion region. In order to read data based on the characteristic 64 in an erasing condition and on the characteristics 60 and 62 in a writing condition, two kinds of reference levels $Iref_1$ and $Iref_2$ are set in the sense amplifier 50 as comparison levels. When a drain current $I_D$ generated between the source diffusion region and the drain diffusion region of a memory transistor is $Iref_2 < I_D$ the datum corresponds to "1"; and when $I_D$ is $Iref_1 < I_D < Iref_2$, the datum corresponds to "2"; and when $I_D$ is $I_D < Iref_1$, the datum corresponds to "3". Owing to the processes as shown in the above, the EEPROM according to the present invention can store three kinds of data, "1", "2" and "3", while in the case of a conventional EEPROM only two kinds of data can be stored. In the above-mentioned embodiment, two kinds of constant voltages 2 V and 4 V are given to the source region and by adding the data in an erasing condition, the memory data of 3 values can be stored. Storage of multi-state data can be extended to 4 values, 5 values or more by increasing the number of prescribed voltages to be given to the source diffusion region.

Figure 10:
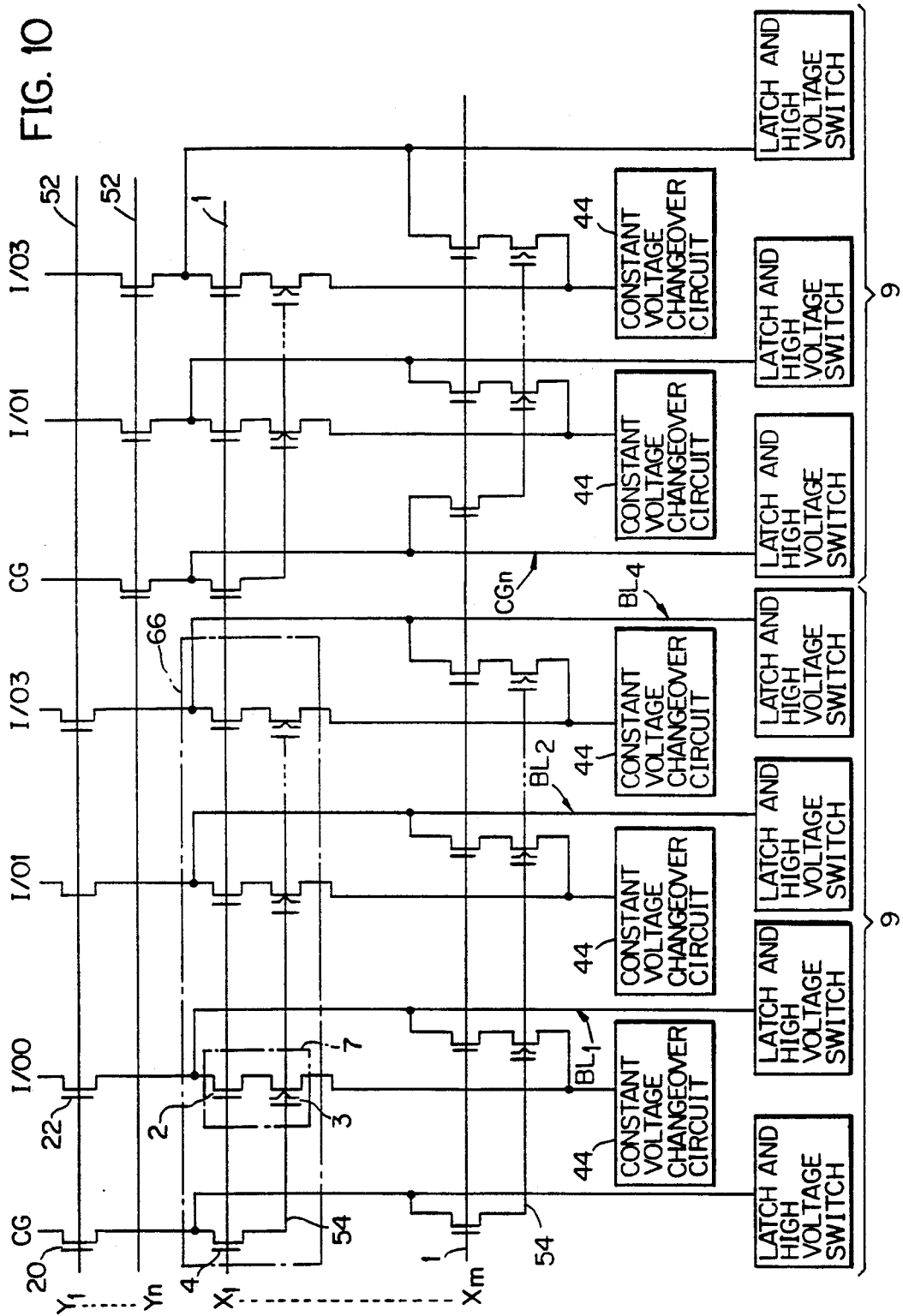
FIG. 10 is a circuit diagram which shows a memory array configuration according to another embodiment of the present invention.

FIG. 10 is a simplified circuit diagram which shows the configuration of a memory cell array in another embodiment of the present invention.

The configuration is explained in the following referring to the drawings. In the figure, 4 units of memory cells 7 are connected in parallel to constitute a memory of 4 bits and each memory cell 7 of 1 bit is constituted with a transistor 2 and a memory transistor 3. A 1 byte memory 66 is constituted with above-mentioned memory cells and a transistor 4 connected to a control gate line 54 which is connected to each of these control gates of the memory transistors 3. Each of these transistors 2 is connected to each of these input/output circuits $I/O_0$ to $I/O_3$ through each of the transistors 22 whose gates are connected to Y decoder connecting lines Y1 of Y gate circuits 12. The transistor 4 is connected to a control gate signal CG through a transistor 20 whose gate is connected to the connecting line Y1. The junction points of the transistor 4 and the transistor 20 are connected to a column latch and a high voltage switch 9 through a control gate line $CG_1$. Each of these junction points of the transistor 2 and the transistor 22 is connected to each of the latches and high voltage switches 9 through bit lines $BL_1$ to $BL_4$ respectively. The source regions of the memory transistor 3 are connected to the constant voltage changeover circuits 44 respectively. In the similar way, a memory of 1 byte is constituted for each of the connecting lines Y2 to Yn and for each of the word lines X2 to Xm and each memory is connected to each latch and high voltage switch 9 and to each constant voltage changeover circuit 44. In this case, the memory data on the memory transistor 3 are the data in 4-logic states, while in a conventional case they are the data in 2-logic states. The EEPROM in this embodiment comprises a transistor for a control gate and memory cells for 4 bits, while 1 byte of the EEPROM of a conventional type comprises a transistor for a control gate and memory cells for 8 bits. And the memory capacity in each of the above cases is the same. As a result, the occupied area by memory cells is decreased by the area occupied by memory cells for 4 bits, which helps develop the degree of integration.

Figure 11:
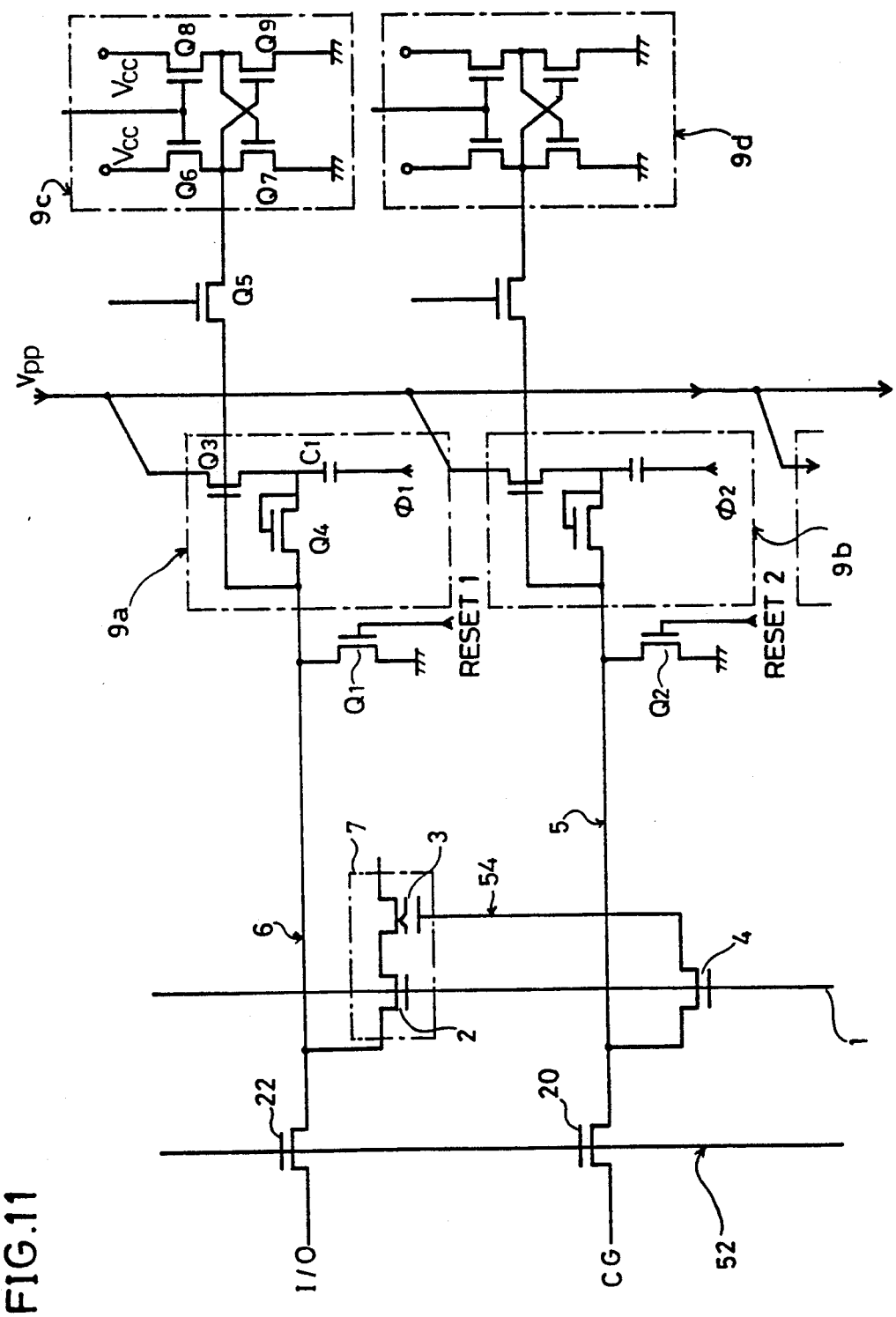
FIG. 11 is a circuit diagram showing the configuration of a column latch and a high voltage switch relating to 1 bit memory cell in the embodiment shown in FIG. 10.

FIG. 11 shows an internal circuit of the latch and the high voltage switch corresponding to memory cells for 1 bit including control gate lines shown in FIG. 10.

The configuration is explained in the following. referring to the drawing.

Figure 13:
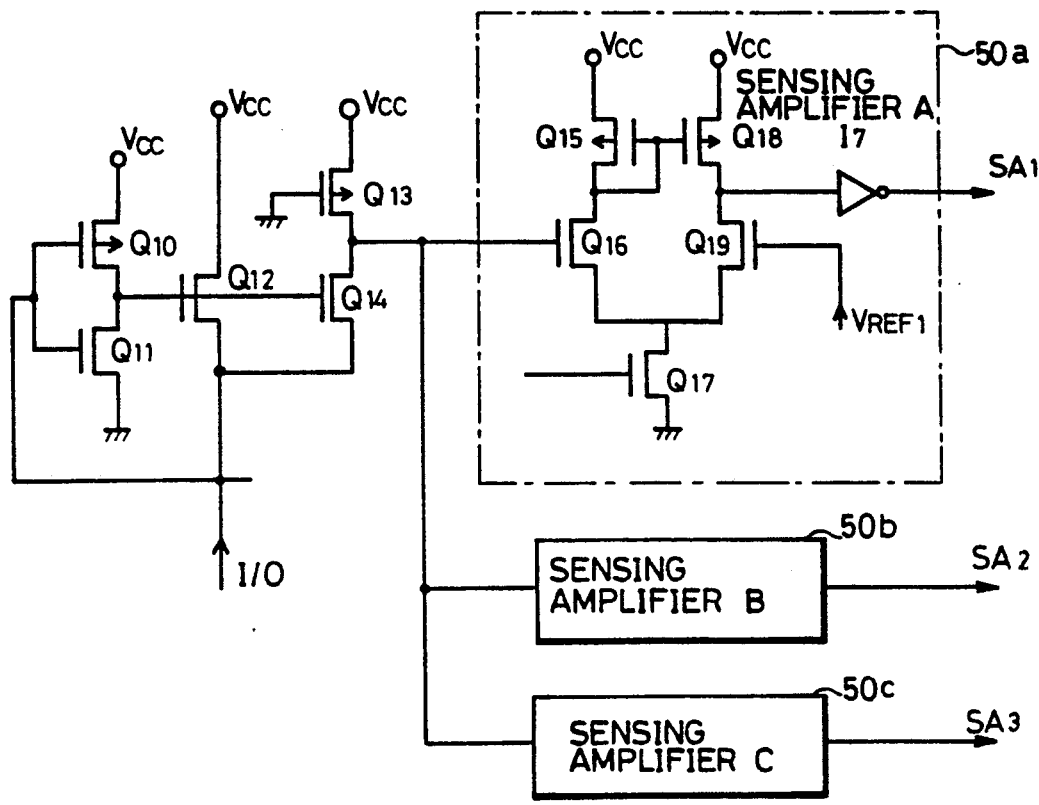
FIG. 13 is a circuit diagram showing the configuration of a sense amplifier in the embodiment shown in FIG. 10.

The internal circuit of the high voltage switch 9a is similar to that shown in FIG. 13 which shows an example of a conventional type device, so that the explanation of it is not described. A boosted high voltage supply source $V_{pp}$ is branched and supplied to high voltage switch 9a provided to individual bit lines and to high voltage switches 9b provided to individual control gate lines 5. A high voltage switch 9a and a memory cell 7 are connected with a bit line 6; a transistor $Q_1$ is connected between the bit line 6 and ground potential. A reset signal Reset1 is coupled with the gate of the transistor $Q_1$; a transistor $Q_2$ is connected between the control gate line 5 and ground potential; a reset signal Reset2 is coupled with the gate of the transistor $Q_2$. By the activities of these reset signals, the bit line 6 and the control gate line 5 can be grounded. Therefore a malfunction is prevented which is caused by the residual of a high voltage applied to the bit line 6 or the control gate line 5 in write operation or in erase operation. A high voltage switch 9a and a data latch 9c are connected to each other through a transistor $Q_5$; a high voltage switch 9b and a control gate line latch 9d are connected to each other through a transistor; the data latch 9c is so constituted that a transistor $Q_6$ and a transistor $Q_7$, and a transistor $Q_8$ and a transistor $Q_9$ are connected in series respectively between the source voltage $V_{cc}$ and ground potential; selective signals are coupled with the individual gates of the transistor $Q_6$ and the transistor $Q_8$; the junction point between the transistor $Q_6$ and the transistor $Q_7$ is connected to the gate of a transistor $Q_9$; the junction point between the transistor $Q_8$ and the transistor $Q_9$ is connected to the gate of the transistor $Q_7$ to form a flipflop circuit. The junction point between the transistor $Q_6$ and the transistor $Q_7$ is connected to the transistor $Q_5$. The configuration of the control gate line latch 9d is similar to that of the data latch 9c, so that the explanation of it is described.

In the configuration as described in the above, an input/output signal I/O reaches the data latch 9c through the transistor $Q_5$ and the signal is latched therein. A control signal CG given to the control gate line 5 through the transistor 20 reaches the control gate line latch 9d and the signal is latched therein.

Figure 12:
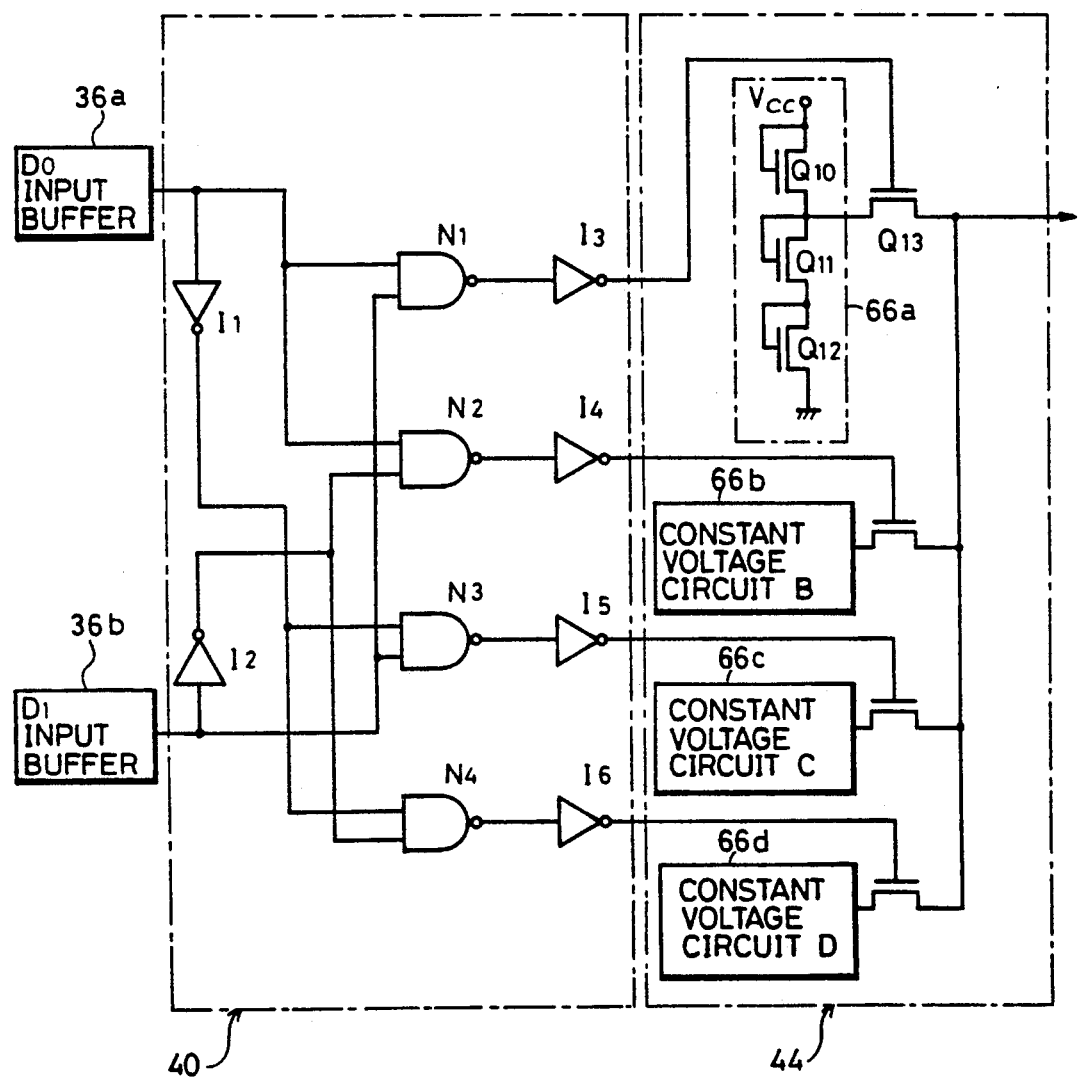
FIG. 12 is a circuit diagram showing an input data conversion circuit and a constant voltage changeover circuit in the embodiment shown in FIG. 10.

FIG. 12 is a circuit diagram showing a concrete configuration of the input data conversion circuit and the constant voltage changeover circuit in the embodiment of the present invention shown in FIG. 10.

The configuration is explained in the following referring to the drawing.

The configuration of the input data conversion circuit 40 is explained in the following: the output of $D_0$ input buffer 36a is input to NAND gates $N_1$ and $N_2$; the output of $D_0$ input buffer 36a is further input to NAND gates $N_3$ and $N_4$ through an inverter $I_1$. The output of $D_1$ input buffer 36b is input to NAND gates $N_1$ and $N_3$ and to NAND gates $N_2$ and $N_4$ through an inverter $I_2$. The output of NAND gates $N_1$, $N_2$, $N_3$ and $N_4$ are connected to the constant voltage changeover circuits 44 through the inverters $I_3$, $I_4$, $I_5$ and $I_6$; the constant voltage changeover circuit 44 comprises a constant voltage circuit A 66a, B 66b, C 66c and D 66d. The constant voltage circuit A 66a includes a transistor $Q_{10}$, a transistor $Q_{11}$ and a transistor $Q_{12}$ which are connected between the source voltage $V_{cc}$ and ground potential in series; the individual gates of the transistors $Q_{10}$, $Q_{11}$ and $Q_{12}$ are connected to the nodes on the side of the source voltage $V_{cc}$; the junction point of the transistors $Q_{10}$ and $Q_{11}$ is connected to the source diffusion region of each memory transistor corresponding to each constant voltage changeover circuit through a transistor $Q_{13}$. The output of the inverter I is coupled with the gate of the transistor $Q_{13}$; in the similar way, the output of constant voltage circuit B, C and D are coupled with the output side of the transistor $Q_{13}$ through transistors. The internal configurations of the constant voltage circuits B, C and D are basically similar to that of the constant voltage circuit A. The output voltages can be different from each other by changing the size of transistors.

The data corresponding to 1 byte (8 bits of $D_0$ to $D_7$) in a conventional device can be stored and held in the similar way in 4 bits [($D_0$, $D_1$), ($D_2$, $D_3$), ($D_4$, $D_5$), ($D_6$, $D_7$)] in the configuration as mentioned in the above. FIG. shows a conversion circuit for the input data of this 1 bit ($D_0$, $D_1$). The binary data are input to $D_0$ input buffer as in a conventional device and also the binary data are input to $D_1$ input buffer. Thereby by the combination of binary data, $D_0$ and $D_1$, four kinds of data can be obtained. On the basis of these four kinds of data, any one among the four kinds of constant voltages is output by the constant voltage changeover circuit, and the voltage is applied to the source diffusion region of a memory transistor. Thereby the data corresponding to two bits in the conventional device are input as 1 bit data to one memory transistor and stored therein. The data corresponding to 1 byte comprising 8 bits as in a conventional device can be replaced with the data of 1 byte configuration comprising 4 bits in this embodiment as shown in FIG. 10.

FIG. 13 is a circuit diagram showing the configuration of a sense amplifier in the embodiment of the present invention as shown in FIG. 10.

The configuration is explained in the following referring to the drawing.

Sense amplifiers are provided to individual lines, input/output lines $I/O_0$ to $I/O_3$, but in this place a sense amplifier is explained which is connected to one of these input/output lines. The transistor $Q_{12}$ is connected between an input line I/O and the source voltage $V_{cc}$; a P type transistor $Q_{10}$ and an N type transistor $Q_{11}$ are connected in series between the source voltage $V_{cc}$ and ground potential; the individual gates of the transistors $Q_{10}$ and $Q_{11}$ are connected to the input/output line I/O. A P type transistor $Q_{13}$ and an N type transistor $Q_{14}$ are connected in series between the input/output line I/O and the source voltage $V_{cc}$; the gate of the transistor $Q_{13}$ is connected to ground potential; the gates of transistors $Q_{12}$ and $Q_{14}$ are connected to the junction points of transistors $Q_{10}$ and $Q_{11}$ The sense amplifier comprises a sense amplifier A 50a, B 50b, C 50c; the junction points between the transistor $Q_{13}$ and $Q_{14}$ are connected to the sense amplifiers A, B and C individually. The sense amplifiers and the configuration is explained in the following: a P type transistor $Q_{15}$ and an N type transistor $Q_{16}$ are connected to the source voltage $V_{cc}$ in series; a P type transistor $Q_{18}$ and an N type transistor $Q_{19}$ are connected to the source voltage $V_{cc}$ in series; each of the transistors $Q_{16}$ and $Q_{19}$ is connected to ground potential though the transistor $Q_{17}$; the gates of the transistor $Q_{15}$ and the transistor are connected to the junction points of the transistor $Q_{15}$ and the transistor $Q_{16}$; the reference potential $Vref_1$ is applied to the gate of the transistor $Q_{19}$; the junction points of the transistor $Q_{18}$ and the transistor $Q_{19}$ are coupled with an output signal SA1 through a inverter $I_7$. The internal configurations of the sense amplifier B 50b and the sense amplifier C 50c are basically similar to that of the sense amplifier A 50a. The reference potentials $Vref_2$ and $Vref_3$ (not shown in the drawing) are different in potential and they are applied to the gates of individual corresponding transistors.

The functions of the circuit are explained in the following.

A drain current of a memory transistor generated in an input/output line I/O is converted to a fixed potential and applied to the gate of the transistor $Q_{16}$. A signal corresponding to the potential applied to the gate of the transistor $Q_{16}$ and the reference potential $Vref_1$ is output as an output signal SA1 through the inverter $I_7$. The potential applied to the gate of the transistor is also applied to the sense amplifier B and the sense amplifier C. Therefore output signals SA2 and SA3 are output corresponding to the reference potential $Vref_2$ and $Vref_3$. On the basis of these signal data, output signal SA1, SA2 and SA3, the data in 4-logic state (4-value data) held in a memory transistor are converted to binary data.

Figure 14:
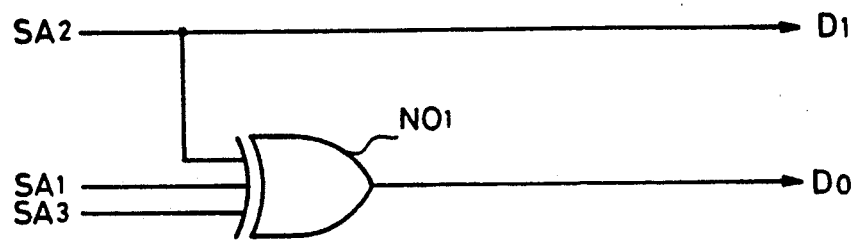
FIG. 14 is a circuit diagram showing the configuration of an output data conversion circuit in the embodiment shown in FIG. 10.

FIG. 14 is a simplified circuit configuration of the output data conversion circuit 42 (shown in FIG. 5) included in the embodiment of the present invention shown in FIG. 10.

Output signals SA1 to SA3 output from sense amplifiers A to C respectively, shown in FIG. 13, are converted to binary data as 1 bit data ($D_0$, $D_1$); to be concrete, the output signal SA2 is output as a binary signal of the bit $D_1$, and the output signals SA2, SA1 and SA3 are coupled with the input of a NOR gate $NO_1$; an output signal of NOR gate $NO_1$ is output as binary data of the bit $D_0$. As mentioned in the above, the data corresponding to 2 bits in a conventional device are stored in the form of 4-value data of 1 bit in a memory transistor; the output data of the memory transistor are again output being converted to the data of 2 bits, in which each bit is a binary value.

Figure 15:
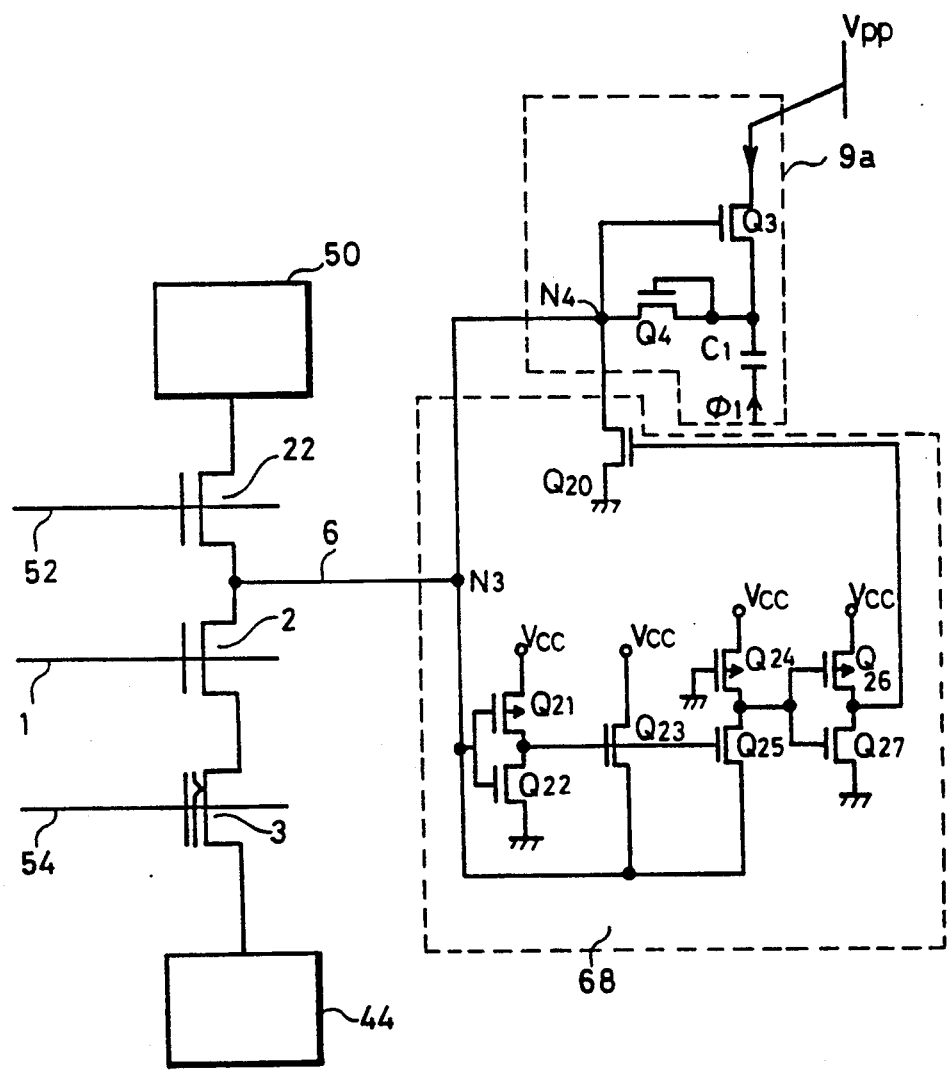
FIG. 15 is a circuit diagram showing a configuration centering on a sense circuit for sensing the end of the write operation corresponding to a single bit memory cell in a further embodiment of the present invention.

FIG. 15 is a circuit diagram showing the configuration around the high voltage switch in a further embodiment of the present invention.

The configuration is explained in the following referring to the drawings.

The configuration itself of a high voltage switch 9a is similar to the high voltage switch 9a shown in FIG. 11 in the former embodiment. In this embodiment, however, a sense circuit 68 for the end of writing is provided in the connecting line (bit line 6) between the transistor $Q_4$ and the junction point of the transistor 22 and the transistor 2.

The configuration of the sense circuit 68 for the end of writing is explained in the following: a P type transistor $Q_{21}$ and an N type transistor are connected in series between the source voltage $V_{cc}$ and ground potential; the gates of the transistor $Q_{21}$ and are connected to a node $N_3$; a transistor $Q_{23}$ is connected between the source voltage $V_{cc}$ and the node $N_3$; a P type transistor $Q_{24}$ and an N type transistor $Q_{25}$ are connected in series between the source voltage $V_{cc}$ and the node $N_3$; the individual gates of the transistors $Q_{23}$ and are connected to the junction points of the transistors $Q_{21}$ and $Q_{22}$; the gate of the transistor $Q_{24}$ is grounded; a P type transistor $Q_{26}$ and an N type transistor are connected in series between the source voltage $V_{cc}$ and ground potential; individual gates of the transistor $Q_{26}$ and $Q_{27}$ are connected to the junction points of the transistor $Q_{24}$ and the transistor $Q_{25}$; the transistor $Q_{20}$ is connected between a node $N_4$ and ground potential; the gate of the transistor $Q_{20}$ is connected to the junction point between the transistor $Q_{26}$ and the transistor $Q_{27}$ The operation of the sense circuit 68 for the end of writing constituted as mentioned in the above is explained in the following.

During write operation is being performed to the memory transistor 3, when the gate voltage of the memory transistor 3 reaches a threshold voltage corresponding to prescribed voltage set by the constant voltage changeover circuit 44, a current starts to flow in the channel region of the memory transistor 3. Therefore a current flows through the bit line 6 from the high voltage switch 9a to a memory cell. A boosted source voltage $V_{pp}$, to be supplied to the high voltage switch 9a is boosted by a charge pump and so it has no power supplying ability. As shown in FIG. 11, the source voltage $V_{pp}$ is also supplied to the high voltage switches corresponding to other bit lines. When the transistor $Q_3$ is made to be in an ON state and a current starts to flow in the bit line 6, the source voltage cannot be kept in a normal level. In other words, if a current starts to flow in a memory transistor, the electric potential level of the source voltage itself is lowered, so that even when the threshold voltage of another memory transistor connected to another bit line is lower than prescribed value, there is a probability that further writing operation is not performed. To prevent this, it is necessary to make the transistor $Q_3$ be in an OFF state without fail when the write operation to the memory transistor 3 is terminated. For this purpose the sense circuit 68 for the end of writing is provided; in the sense circuit 68 for the end of writing, the current which flows through the node $N_3$ of the bit line 6 is detected and when the current exceeds a certain value the transistor $Q_{20}$ is turned ON: then a node $N_4$ of the bit line 6 connected to the transistor $Q_{20}$ is grounded. Because of this $Q_3$ is securely turned OFF, and as a result of this, a leakage current in the bit line 6 is cut off, so that it is made possible to perform a reliable write operation without affecting the boosted source voltage $V_{pp}$.

In place of the sense circuit for the end of writing, a high voltage switch 9a can be set as described in the following.

The leakage current in a bit line, at the time when write operation to the memory transistor 3 is terminated, shall be calculated beforehand, and the potential of the node N4 shall be calculated based on this current and the resistance of the bit line 6. If a transistor Q3 which is turned OFF securely at the calculated potential of the node N4 is selected, a similar effect can be obtained.

In the embodiment shown in FIG. 10, 1 byte is constituted with memory cells of 4 bits to store the data for 8 bits in a conventional device; it is also possible to constitute 1 byte with memory cells of a 8 bits to store the data for 16 bits in a conventional device.

In the above-mentioned embodiment, the binary data as input/output data of EEPROM are converted into multi-state data to store them in a memory transistor but it is also possible to use multi-state data as input/output data of the EEPROM. In other words, for the exchange of data with the peripheral units of the EEPROM, not only the digital data based on the binary scale, but also multi-state data of more than ternary scale can be applied.

In the above embodiment, the idea of the present invention is applied to the EEPROM of an N channel type but of course it can be also applied to the EEPROM of a P channel type.

While in a conventional device only binary data have been able to store in a memory transistor of an EEPROM, according to the present invention, in write operation prescribed voltage is given to a source region, and by changing the prescribed voltage optionally multi-state data can be memorized. Owing to this, it is possible to obtain an EEPROM which contributes for developing an integrated circuit of a large capacity or of high degree of integration.

According to the present invention, the write operation of multi-state data to a memory transistor of 1 bit does not affect the write operation to another bit, so that an EEPROM of excellent reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile memory device capable of storing multi-state data having more than two states based on a threshold voltage, said multi-stage data corresponding to binary data, comprising:

an input data converting means for converting N (a natural number larger than 1) binary signals into $2^N$ multi-state data to be stored and including constant voltage generating means for generating $2^N$ values of constant voltage corresponding to the $2^N$ multi-state data;

an output data converting means for converting said stored multi-state data into binary signals;

a drain electrode, a source electrode and a control gate electrode;

a floating gate to and out of which electric charge is injected or subtracted, said drain, source and control gate electrodes provided around said floating gate to constitute a memory transistor for storing said multi-state data, and said drain electrode and said source electrode are formed on a semiconductor substrate;

charge injecting means for injecting electric charge into said floating gate, said charge injecting means including first voltage applying means for applying zero potential to said control gate electrode and to said semiconductor substrate and for applying positive high voltage to said drain electrode in a data write operation, and second voltage applying means for applying zero potential to said drain electrode, to said source electrode and to said semiconductor substrate, and for applying positive high voltage to said control gate electrode in a data erase operation; and control means for controlling the amount of electric charge to be injected by said charge injecting means, said control means including means for applying one of said $2^N$ values of constant voltage generated by said constant voltage generating means to said source electrode to control charge injected into said floating gate during a write operation, wherein said threshold voltage of said memory transistor is determined based on the injected amount of electric charge.

2. A non-volatile memory device according to claim 1, further comprising data reading means for reading data, wherein said data reading means includes third voltage applying means for applying zero potential to said control gate electrode and to said source electrode and for applying a predetermined positive voltage to said drain electrode in a data read operation, detecting means for detecting a current generated by said third voltage applying means between said source electrode and said drain electrode through said semiconductor substrate, and signal generating means for generating an output signal according to a current detected by said detecting means.

3. A non-volatile memory device according to claim 2, wherein said signal generating means comprises:

voltage generating means for generating M ($2^N$... N: a natural number larger than 1) values of voltage corresponding to M values of the detected currents, and binary signal generating means for generating $\sqrt{M}$ binary signals corresponding to said M values of voltage provided by said voltage generating means using (M−1) predetermined voltages.

4. A non-volatile memory device according to claim 1, wherein a plurality of said floating gates and said charge injecting means are arranged on the non-volatile memory device, and each of said charge injecting means is connected to a common voltage source and includes voltage source releasing means for releasing the connections with said common voltage source when the injection of electric charge into each of said floating gates by each of said charge injecting means has been stopped.

5. A non-volatile memory device according to claim 1, wherein a plurality of floating gates and said charge injecting means are arranged on the non-volatile memory device, and each of said individual electric charge injecting means is connected to a common voltage source and includes voltage source releasing means for releasing the connections with said common voltage source when the injection of electric charge into each of said floating gates by each of said charge injecting means has been stopped.

6. A non-volatile memory device according to claim 5, wherein said voltage source releasing means comprises:

detecting means for detecting a current generated between said source electrode and said drain electrode through said semiconductor substrate when the injection of electric charge into said floating gate electrode in said data write operation has been stopped, and switching means for cutting off the connection with said common voltage source in response to an output detected by said detecting means.

7. A non-volatile memory device capable of storing multi-state data having more than two states based on a threshold voltage comprising:

input data converting means for converting N (a natural number larger than 1) binary signals into $2^N$ multi-state data to be stored and including constant voltage generation means for generating 2N values of constant voltage corresponding to the $2^N$ multi-state data;

a drain electrode, a source electrode, and a control gate electrode;

a floating gate to and out of which electric charge is injected or subtracted, said drain, source and control gate electrodes provided around said floating gate electrode to constitute a memory transistor, and said drain electrode and said source electrode are formed on a semiconductor substrate;

charge injecting means for injecting electric charge into said floating gate, said charge injecting means including first voltage applying means for applying zero potential to said control gate electrode and to said semiconductor substrate and for applying positive high voltage to said drain electrode in a data write operation, and second voltage applying means for applying zero potential to said drain electrode, to said source electrode and to said semiconductor substrate, and for applying positive high voltage to said control gate electrode in a data erase operation; and control means for controlling the amount of electric charge to be injected by said charge injecting means said control means including means for applying one of said $2^N$ values of constant voltage generated by said input data converting means to said source electrode to control charge injected into said floating gate during the data write operation wherein said threshold voltage is determined based on the injected amount of electric charge.

8. A non-volatile memory device capable of storing multi-state data comprising:

input signal converting means for converting a binary input signal into multi-state input data having more than 2 values;

a memory cell for storing input data including a floating gate to and out of which electric charge is injected and subtracted, with a drain electrode, a source electrode and a control gate electrode formed around said floating gate to constitute a memory transistor;

a semiconductor substrate on which said drain electrode and said source electrode are formed;

writing means for writing said multi-state input data to said memory cell as said input data;

reading means for reading the data written in said memory cell; and output signal converting means for converting the data read by said reading means into a binary output signal;

said input signal converting means including signal converting means for converting N (a natural number larger than 1) binary signals into $2^N$ multi-state data, and constant voltage generating means for generating $2^N$ values of predetermined non-zero voltage corresponding to the $2^N$ multi-state data; and said writing means including electric charge injecting means for injecting electric charge into said floating gate, and controlling means for controlling the amount of electric charge to be injected by said electric charge injecting means including means for applying one of the $2^N$ values of predetermined non-zero voltage to said source electrode.

9. A non-volatile memory device according to claim 8, wherein said electric charge injecting means comprises:

first voltage applying means for applying zero potential to said control gate electrode and to said semiconductor substrate and for applying positive high voltage to said drain electrode in a data write operation; and a second voltage application means for applying zero potential to said drain electrode, to said source electrode and to said semiconductor substrate, and for applying positive high voltage to said control electrode in a data erase operation.

10. A non-volatile memory device according to claim 9, wherein said reading means comprises:

fourth voltage applying means for applying 0 potential to said control gate electrode and to said source electrode and for applying prescribed positive voltage to said drain electrode during a data read operation;

detecting means for detecting a current generated between said source electrode and said drain electrode through said semiconductor substrate by said fourth voltage applying means; and signal generating means for generating an output signal according to the current detected by said detecting means.

11. A non-volatile memory device according to claim 10 wherein said output signal converting means comprises:

voltage generating means for generating M ($2^N$ ... N: a natural number larger than 1) values of voltage corresponding to M values of the detected currents, and binary signal generating means for generating $\sqrt{M}$ binary signals corresponding to said M values of voltage produced by said voltage generating means using and to (M−1) values of predetermined voltage.

12. A non-volatile memory device according to claim 8, wherein:
a plurality of said memory cells and said electric charge injecting means are arranged on the non-volatile memory device, and each of said electric charge injecting means is connected to a common voltage source and includes voltage source releasing means for releasing the connection with said common voltage source when the injection of electric charge into each of said floating gates by each of said electric charge injecting means has been stopped.

13. A non-volatile memory device according to claim 12, wherein said source voltage releasing means comprises:
detecting means for detecting a current generated between said source electrode and said drain electrode through said semiconductor substrate when the injection of electric charge into said floating gate electrode in said write operation of data is stopped; and
switching means for cutting off the connection with said common voltage source in response to an output detected by said detecting means.

* * * * *